(12) United States Patent
Bertrand et al.

(10) Patent No.: US 8,399,178 B2
(45) Date of Patent: Mar. 19, 2013

(54) METHOD OF PRODUCING A RELIEF IMAGE ARRANGEMENT USABLE IN PARTICULAR IN THE FIELD OF FLEXOGRAPHY AND ARRANGEMENT PRODUCED ACCORDING TO THIS METHOD

(76) Inventors: Dominique Bertrand, Cernay (FR); Chouaib Boukaftane, Mulhouse (FR); Christian Grab, Emmenbrucke (CH)

( * ) Notice: Subject to any disclaimer, the term of this patent is extended or adjusted under 35 U.S.C. 154(b) by 377 days.

(21) Appl. No.: 12/733,986

(22) PCT Filed: Oct. 2, 2008

(86) PCT No.: PCT/FR2008/051787
§ 371 (c)(1),
(2), (4) Date: Apr. 7, 2010

(87) PCT Pub. No.: WO2009/053586
PCT Pub. Date: Apr. 30, 2009

(65) Prior Publication Data
US 2010/0316957 A1    Dec. 16, 2010

(30) Foreign Application Priority Data
Oct. 5, 2007    (FR) ...................................... 07 58117

(51) Int. Cl.
*G03F 7/00* (2006.01)
*B41M 5/00* (2006.01)
(52) U.S. Cl. ..................................... 430/306; 101/463.1
(58) Field of Classification Search .................. 430/300, 430/306
See application file for complete search history.

(56) References Cited

U.S. PATENT DOCUMENTS

| 5,783,356 | A  | * | 7/1998 | Bosschaerts et al. ......... 430/240 |
| 6,886,825 | B2 |   | 5/2005 | Graf et al. |
| 6,967,670 | B2 |   | 11/2005 | Berner et al. |
| 2002/0117067 | A1 | * | 8/2002 | Fischer et al. ............. 101/463.1 |
| 2005/0058948 | A1 |   | 3/2005 | Freese et al. |
| 2005/0150407 | A1 | * | 7/2005 | Kuczynski et al. ........ 101/401.1 |
| 2006/0023024 | A1 | * | 2/2006 | Niekawa .......................... 347/37 |
| 2007/0014929 | A1 | * | 1/2007 | Eggers ....................... 427/372.2 |
| 2008/0258344 | A1 | * | 10/2008 | Regan et al. .................. 264/400 |

FOREIGN PATENT DOCUMENTS

| EP | 1 746 462 | 1/2007 |
| WO | 99/64929 | 12/1999 |
| WO | 03/058349 | 7/2003 |

* cited by examiner

*Primary Examiner* — Cynthia Kelly
*Assistant Examiner* — Chanceity Robinson
(74) *Attorney, Agent, or Firm* — Carmody & Torrance LLP

(57) ABSTRACT

The invention relates to a method of producing a relief image arrangement, usable especially in the fields of flexography, embossing and heliogravure, and comprising a base layer and a layer of photosensitive material fixed on the base layer. The method is of the type according to which an image is produced on the photosensitive layer by causing selective curing by irradiating the zones that are to be in relief with light of a predetermined wavelength. The method is characterized in that the image is produced in the form of a set of points to which a substantially pyramidal shape is given, widening out in the direction of the base layer (5). The invention is usable for producing relief images, in the field of flexography.

12 Claims, 9 Drawing Sheets

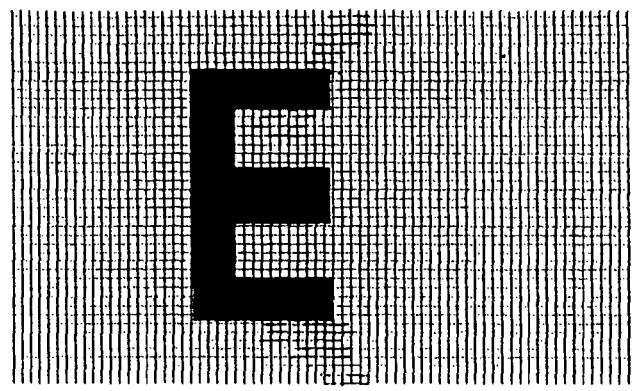
_Fig. 1_
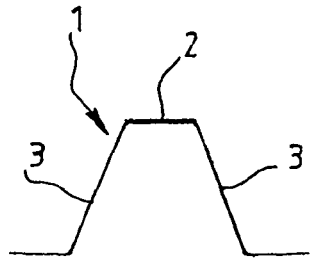
_Fig. 2A_
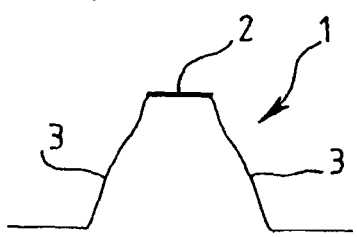
_Fig. 2B_
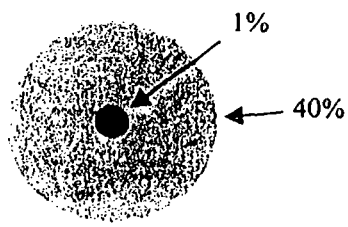
_Fig. 3A_
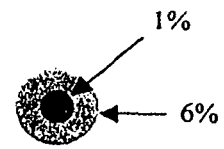
_Fig. 3B_
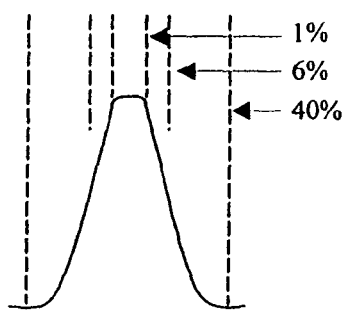
_Fig. 4_
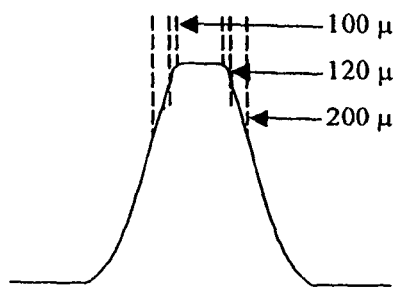
_Fig. 5_

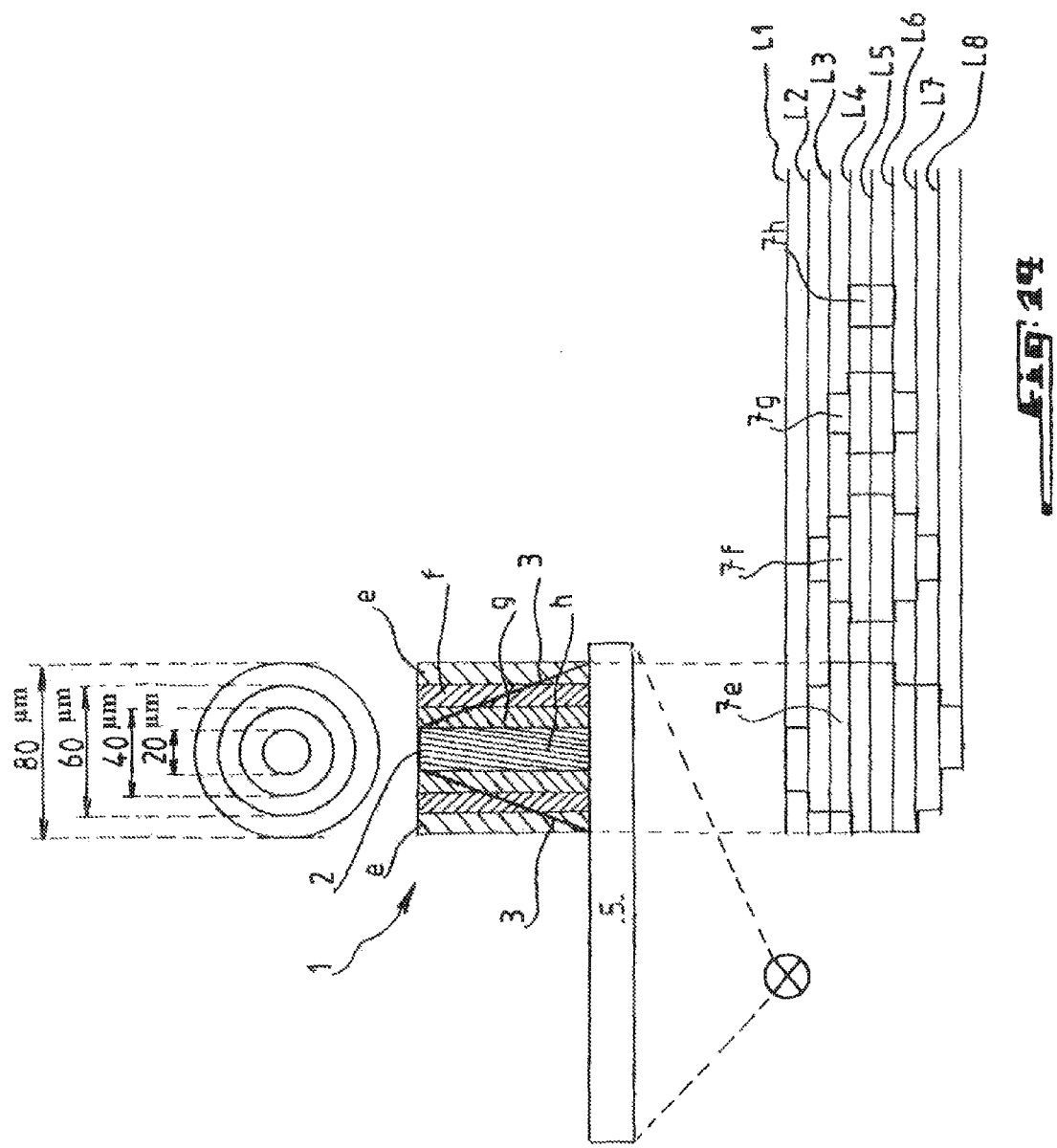

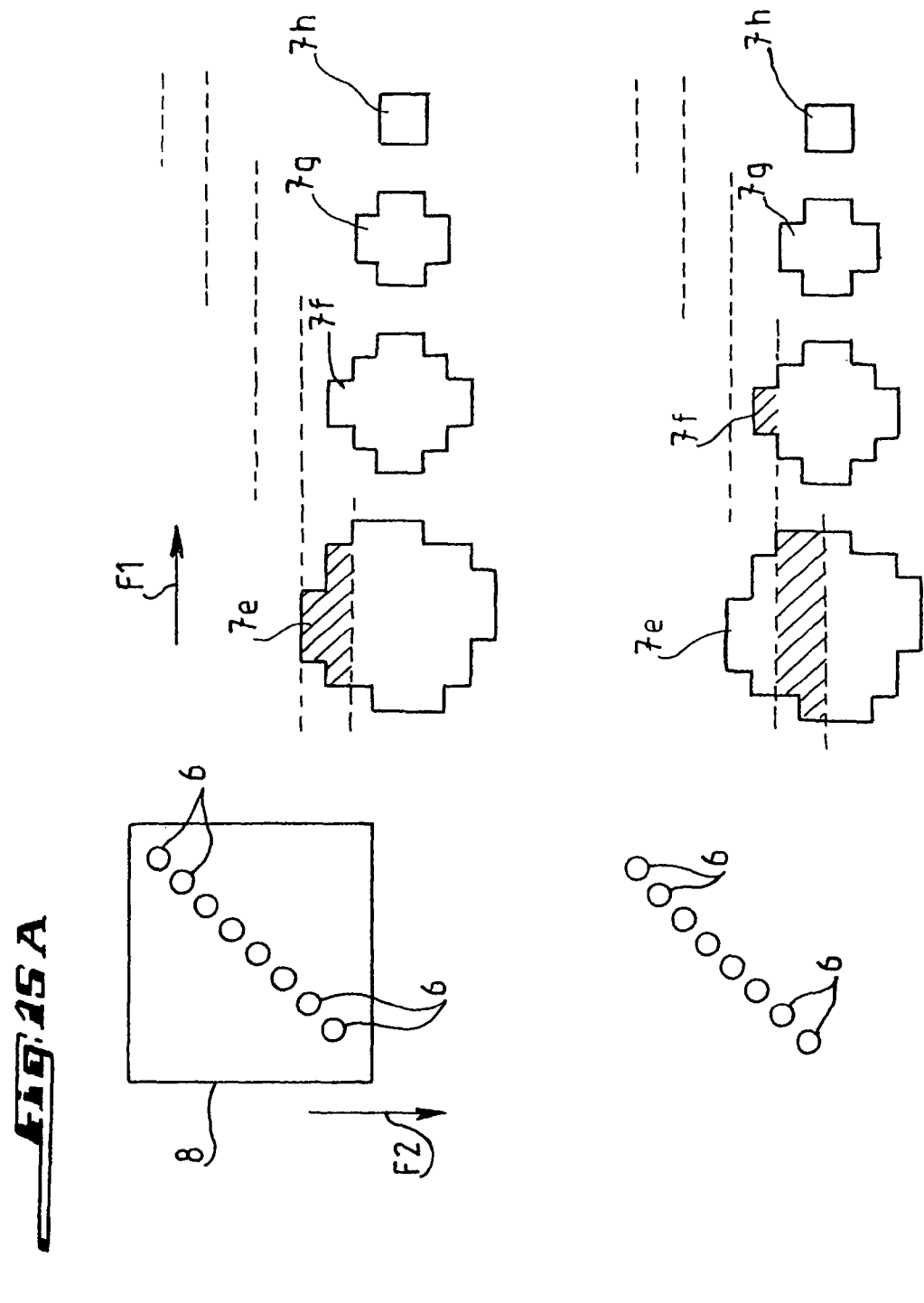

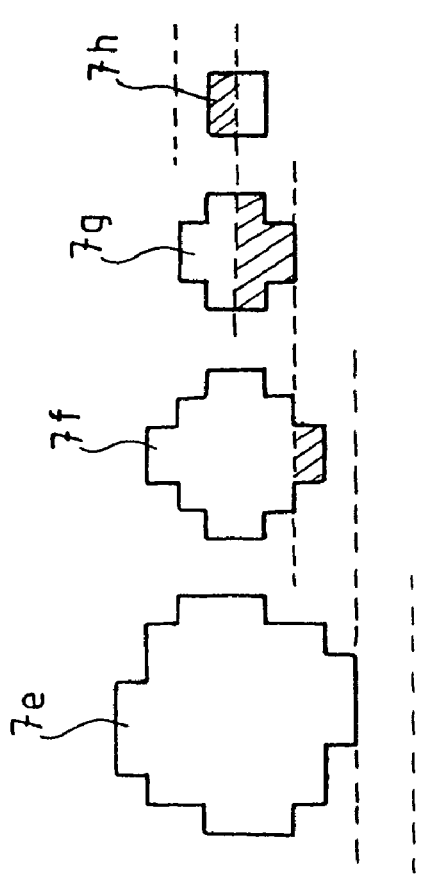
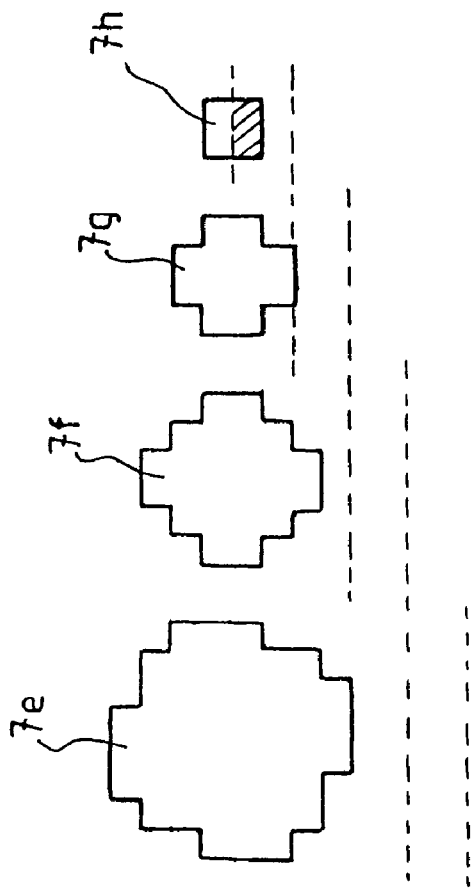
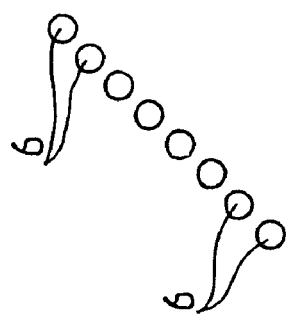
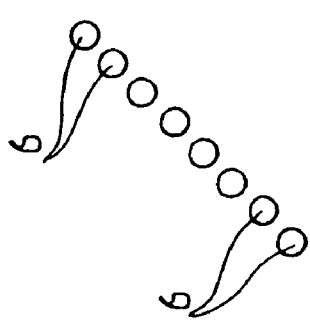
Fig. 15E  Fig. 15F

METHOD OF PRODUCING A RELIEF IMAGE ARRANGEMENT USABLE IN PARTICULAR IN THE FIELD OF FLEXOGRAPHY AND ARRANGEMENT PRODUCED ACCORDING TO THIS METHOD

CROSS REFERENCE TO RELATED APPLICATIONS

This application is a National Stage application of International Application No. PCT/FR2008/051787, filed Oct. 2, 2008, the subject matter of which is incorporated by reference in its entirety.

The invention concerns a procedure of producing a relief image arrangement usable in particular in the field of flexography consisting of a base layer and a layer of a photosensitive material fixed on the base layer, of the type according to which one produces an image on the photosensitive layer by provoking a selective crosslinking by exposure in the zones which must be put in relief by light of a predetermined wavelength, and an arrangement produced according to this procedure.

A procedure and an arrangement of this type are already known by the French patent No. 2,834,802. Yet, it has been proven that the technology described in this patent presents the inconvenience that the parts in relief formed by points of screen and by positive lines have configurations of shoulder that have as a consequence [the characteristic] that points of small diameter and spaced out or positive straight lines are fragile to the engraving of blocks and unstable by deforming under the effect of the pressure of printing, provoking a lack of tonal scope in the highlights or a lack of detail in a more general way. Furthermore, some points obtained, wider and more closely spaced in the shadows, constitute blocked reserves, which provokes an excessive growth and limited shadows in tonal scope as well.

The purpose of the invention is to palliate this inconvenience.

In order to attain this goal, the procedure according to the invention is characterized in that one produces the image in the form of a set of points to which one gives a distinctly pyramidal shape, which widen out toward the base layer.

According to one characteristic of the invention, one exposes only the zone of the apex of one point of image to the totality of the luminous energy necessary for the complete crosslinking of the photosensitive layer in this zone and the zones around the apex to fractions of this energy, which diminishes in the direction of distancing from the apical zone so that the solubility of the material of the photosensitive layer in these zones increases in this direction.

According to one characteristic of the invention, the procedure is characterized such that one point of image is produced in the form of one screen point formed by a multitude of pixels.

According to another characteristic of the invention, the procedure is characterized such that the light of exposure of the layer of photosensitive material is a laser beam of a wavelength comprised between 390 and 410 nm, preferably on the order of 405 nm.

According again to another characteristic of the invention, the procedure is characterized such that one uses luminous sources operating in the UV range with a wavelength of 325 to 375 nm, these sources could be lasers.

According to another characteristic of the invention, the procedure is characterized such that one screen point is formed by the successive exposure of zones of points of decreasing sizes to a level of radiant energy corresponding to an appropriate fraction of the energy necessary for the total crosslinking of the photosensitive material.

According again to another characteristic of the invention, the procedure is characterized such that one screen point is produced by many back and forth passes of a laser beam.

According again to another characteristic of the invention, the procedure is characterized such that one screen point is produced by different scans put in operation by using many laser beams operating in parallel during the same pass.

According again to another characteristic of the invention, the procedure is characterized such that one point of screen is produced by the use of a support head of a row of a plurality of lasers offset in the direction perpendicular to the scan, which advances after each scan in the direction perpendicular to the scan by a step corresponding to the width of a zone of exposure which is different in the direction of advancement.

According again to another characteristic of the invention, the procedure is characterized such that the power per laser is comprised between 10 and 300 mW, preferentially between 10 and 20 mW.

According again to another characteristic of the invention, the procedure is characterized such that the size of the pixels used to scan the surface to be imaged is comprised between 6 and 15 micrometers.

According again to another characteristic of the invention, the procedure is characterized such that the number of lasers used is appropriately comprised between 1 and 256.

According again to another characteristic of the invention, the procedure is characterized such that the resolution of the relief image produced is comprised between 1,000 dpi and 8,000 dpi.

According again to another characteristic of the invention, the procedure is characterized such that the screen rulings are comprised between 60 lpi and 200 lpi.

According again to another characteristic of the invention, the procedure is characterized such that one uses as a support of the relief images plates, sleeves and cylinders.

According again to another characteristic of the invention, the procedure is characterized such that one uses photopolymers in liquid, semi-liquid or solid phase.

According again to another characteristic of the invention, the procedure is characterized such that the arrangement of support is likely to be with or without a base, compressible or not.

According again to another characteristic of the invention, the procedure is characterized such that the support is made of polyester or an analog thereof.

According again to another characteristic of the invention, the procedure is characterized such that the support is made of a metal such as steel or aluminum.

According again to another characteristic of the invention, the procedure is characterized such that it consists of a layer of a photosensitive material of which the exterior face is in relief and formed by points of image in a pyramidal shape.

According again to another characteristic of the invention, the procedure is characterized such that one point of image is formed by a plurality of pixels.

According again to another characteristic of the invention, the procedure is characterized such that the photosensitive layer is fixed on a support.

According again to another characteristic of the invention, the procedure is characterized such that the support is in the form of a plate, a sleeve or a cylinder.

According again to another characteristic of the invention, the procedure is characterized such that the support is made of polyester or of a metal such as steel or aluminum.

According again to another characteristic of the invention, the procedure is characterized such that a plate, sleeve or cylinder has a thickness of photosensitive material comprised between 0.4 mm and 6.35 mm.

According again to another characteristic of the invention, the procedure is characterized such that the degrees of hardness of the plates, sleeve or cylinder are comprised between 25 ShA and 75 ShD.

According again to another characteristic of the invention, the procedure is characterized such that the resolution of the image is comprised between 1,000 dpi and 8,000 dpi.

According again to another characteristic of the invention, the procedure is characterized such that the screen rulings are comprised between 50 lpi and 200 lpi.

According again to another characteristic of the invention, the procedure is characterized such that the power of the lasers is modulated.

According again to another characteristic of the invention, the procedure is characterized such that one produces the image by multiple scans during the same pass or during successive passes with a guiding of the lasers by digital files which make it possible to modulate the total energy received at each point of the relief plate to be imaged by controlling the shoulders of the printing zones, after engraving, and in order to optimize the tonal scope and the maintenance of the details.

It is appropriate to insist on the fact that the modulation of the energy at each point of the relief plate to be imaged or of the printing form to be produced can be done by the effect of several physical passes of the lasers all together on its surface with a scan at the level of each point each time.

The above-referenced modulation can also be done in a single pass of the set of lasers with a coverage at each advance, or revolution in the case of a helicoidal scan on a drum, making it possible to do multiple individually power-modulated scans at each point.

A pass thus characterizes the advancement of the laser head in its entirety and a scan the action of one or more laser(s) at the level of each exposed point.

The invention will be better understood, and among other purposes, characteristics, details and advantages of it will appear more clearly in the course of the explanatory description which will follow, making reference to the schematic diagrams attached, given only as an example illustrating a method of producing the invention and in which:

FIG. 1 is a schematic view showing the principle of a relief image on a printing plate in relief;

FIG. 2A schematically illustrates a point of screen produced without gradation of the reticulation around the point and FIG. 2B schematically illustrates a point of screen produced according to the invention;

FIGS. 3A and 3B schematically illustrate two phases of the construction of a screen point, in accordance with the invention;

FIG. 4 is a schematic view of the relief of the screen point of which two phases of construction are represented in FIGS. 3A and 3B;

FIG. 5 is a schematic view illustrating the production, according to the invention, of a fine line according to the invention;

FIG. 14 is a schematic view illustrating the production of a screen point according to the invention, using a head with several laser beams.

Figure 6:
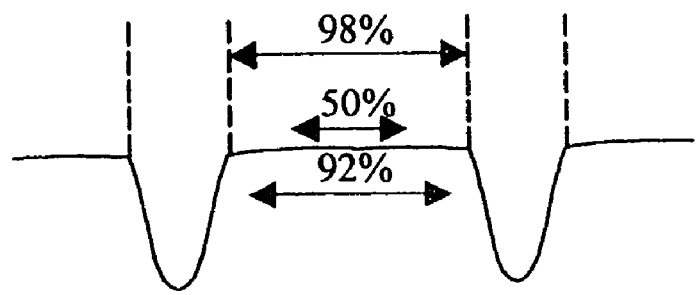
FIG. 6 is a schematic view of a screen point of large diameter and close to another one in a shaded zone, in accordance with the invention.

The invention will be described in its application to a procedure of producing imagery of a plate or block of flexography. Of course, the invention can be used in other fields, such as embossing in relief, typography and applications of the rotogravure type.

In its application to imaging on plates, flexography and sleeves, one uses as a luminous source of exposure of the zones to he crosslinked laser diodes operating in the violet range, at the frontier between ultraviolet and visible light, of a wavelength of 390 to 410 nm and photopolymers which have been adapted and rendered sensitive to this light. One preferably uses a set of laser diodes operating in parallel at wavelengths of 405 nm, arranged in such a way as to direct parallel beams of light of specified deviation onto the plate or the sleeve and distinctly perpendicularly to their surface. These diodes present the advantage that they are widely used in data storage systems and applications of production of offset plates involving certain types of procedures known by the terms "Computer to Plate" (CTP).

The invention uses the technology known by the terms "autotypical halftone process", according to which the image is in relief and formed by points of screen which are constituted by a plurality of elementary points called pixels and whose production involves the use of digital technology. The invention thus concerns a procedure of digital imaging directly onto a plate made of photosensitive material by analogy with the imaging on a negative film or a so-called "ablatable" mask or a printed format.

FIG. 1 illustrates the principle of an image in relief according to the invention composed of black zones which have been exposed to the light and which are thus crosslinked and unexposed zones, in white, in which the material of the photosensitive layer has been able to be removed by using, for example, a solvent. One confirms that the design in relief, that is the letter "E" is formed by juxtaposed pixels, each one in a cell of a grid of lines and of columns. In a general way, in a relief image according to the invention, a screen point covers a certain percentage of the surface and it is the integration ability of the observer's eye that makes it so that the Observer does not perceive that the image is formed by distinct points, but sees only a continuous relief zone, of course on the condition that the resolution is sufficiently high. By resolution, one understands the density of the number of points reproduced by printing by inked point, defined by the expression dpi (dots per inch, that is, points per inch). By the term "screen ruling" one understands the number of cells of halftone per inch. The screen ruling makes it possible to print the levels of grey or to separate the colors. It is also called screen: lines per inch, lpi (lines per inch) or lines per centimeters. When one speaks later of a screen of, for example, 1%, it is a value of covering of surface in percentage by points of screen for a given screen ruling, for example between 130 or 175 lpi, 175 lpi corresponds to 69 lines per centimeter.

The purpose of the invention is the production of image points, that is of screen, (in relief) in such a way that they have a stable form, deforming very little under the effect of printing, in particular when they are points of highlight or provoking blocked reserves, an excessive over inking and limited shadows in total scope. FIGS. 2A and 2B illustrate in A, a screen point 1 which presents a pyramidal form and a surface of apex 2, that is the same contact during printing, which is flat and which does not essentially increase, due to the shoulders 3, stable at the point, even when they deform under the effect of printing.

The pyramidal structure of the screen points, according to the invention, each one formed by a multitude of pixels, is obtained by a control of the shoulders 3 of the points and of the lines by using a metering of the incident light in the photosensitive material of the plate to be imaged. Since the light appropriately formed by a laser beam is coherent and distinctly perpendicular to the surface of the plate, the crosslinking induced by the radiation is done in a dominant manlier at a depth according to the design scanned on the surface of the plate. The consequences are that the shoulders 3 of the points of highlight and of the positive lines depend exclusively on the diffusion of the light in the medium, that is, the photosensitive material.

The invention is based on the fact that the peaks of the points, by being totally crosslinked and being able to resist the later washing, must have received a predetermined quantity of energy, provided that the zones which have received less light energy are less crosslinked and are more dissolvable as a consequence. The energy necessary for the crosslinking of the photosensitive material can be dispensed in one exposure, that is a single scan by laser beam or by several successive passages of the same point or pixel. The fact of distributing the energy over several sequential scans makes it possible to modulate the dose of light dispensed to each point of the future plate or each Pixel, each scan being determined by digital instructions coming from what one calls a rip file, programmed so as to obtain the required effects, that is the control of the shoulders of the points in relief and of the printed zones in general after engraving.

Thus, the generation of a screen point of 1% or of an isolated point of small diameter can be done by scanning a first time as if the distribution of the pixels which form this point corresponded to a point of screen enlarged to 40%, in accordance with FIG. 3A. It is the 40% zone in light grey around the center in dark grey of 1%, later forming the apex 2 which is irradiated in the course of this first pass. During a second pass, one scans with a pixel distribution corresponding to a screen point enlarged to 6%, in accordance with FIG. 3B. Given that, in the material, that is the pixels located in the circle of 6% have received the energy of two passes, they are more crosslinked than the pixels between the 6% circle and the 40% circle and thus less dissolvable. The creation of a screen point of 1% is then completed by scanning an appropriate number of additional times, in such a way that only the zone corresponding to the 1% circle is entirely crosslinked cured and thus entirely insoluble.

By modulating the energies provided by the laser at each pass, one can apply different values of energy.

The invention makes it possible to optimize the construction of the points. The fact of sending energy during two first passes in the neighborhood of the screen point to be formed makes it possible to render the material insoluble in this zone in a very controlled manner and thus create an optimal shoulder which remains after engraving by solvent or by thermal means, as illustrated in FIG. 4. Yet, in the absence of the manipulation of the size of the screen points during two or more scans, such as described above, the screen point would have shoulders rendering it mechanically unstable. One easily understands that by varying the supply of energy to the neighborhood of the point of highlight to be imaged, one can control its shoulder and its anchoring. Several passes allowing for a metering by concentric circles or in any other geometric form desired.

The generation of a fine positive relief line of 100 µm (micrometers), for example, can in a similar way be produced with several passes. The first pass could usefully be done with a distribution of pixels corresponding to a line of 200 µm overflowing each side of the desired line by 50 µm. The second pass could usefully be done with a distribution of pixels corresponding to a line of 120 µm overflowing on each side of the desired line by 10 µm. The other passes will be done with a distribution of pixels corresponding to the line of 100 µm, as wished. FIG. 5 illustrates which has just been described.

In a symmetrical manner, one can reduce the effects of diffusion of light in the shadows by manipulating in the opposite direction the files of pixels with imaging in several passes. For a shade screened at 98%, one could make a first pass at 50%, and then a pass at 92% and then passes at 98% to reduce the effects of diffusion affecting the opening of the reserves, as one sees in FIG. 6.

In the same way for a reserve of 200 micrometers, for example, one could manipulate its digital size by carrying out two passes with a size of 200 micrometers followed by a pass with a size of 240 micrometers and finishing with a pass where the reserve is brought to a size of 300 micrometers.

Figure 7:
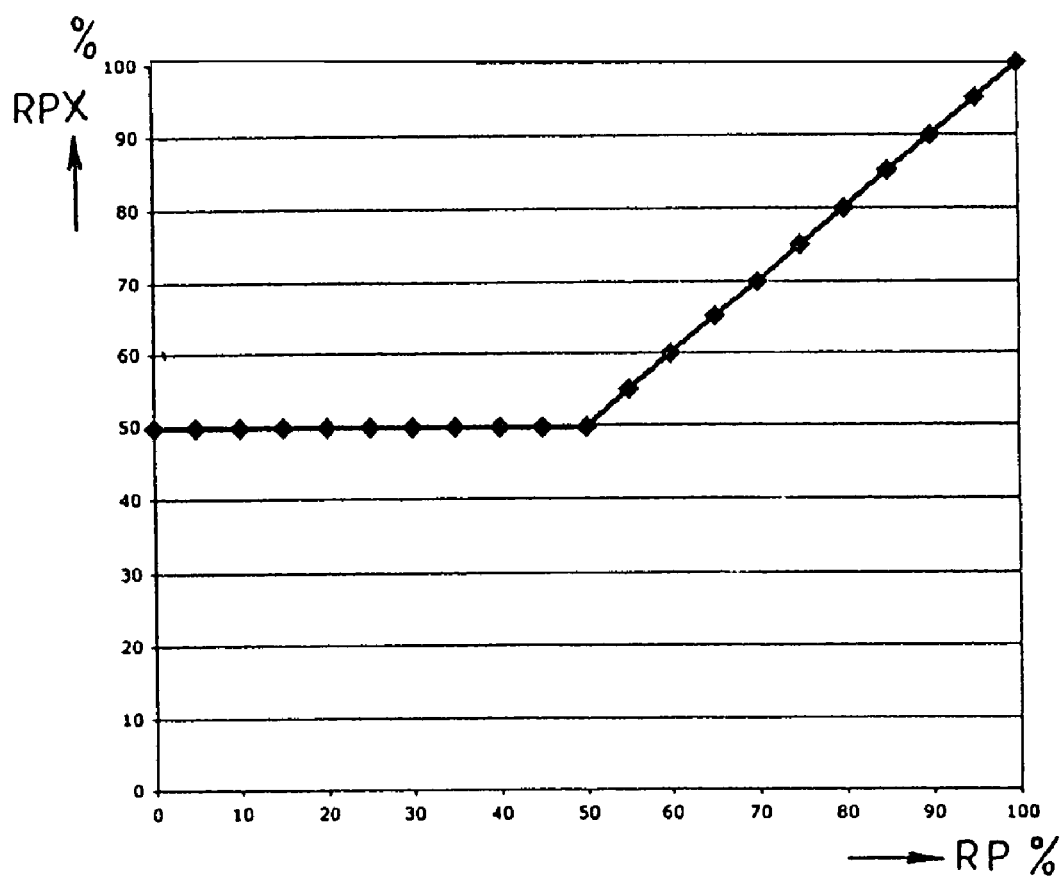
FIGS. 7 to 9 illustrate strategies of the implementation of three phases of the construction by multiple passages of exposure light, of one point of screen according to the invention.
Figure 8:
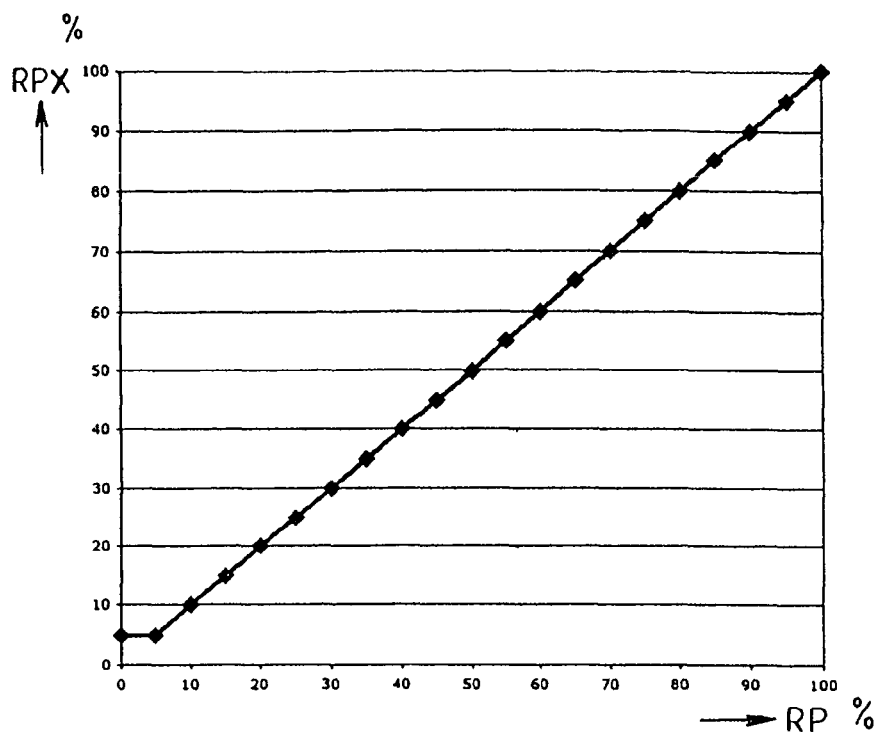
Figure 9:
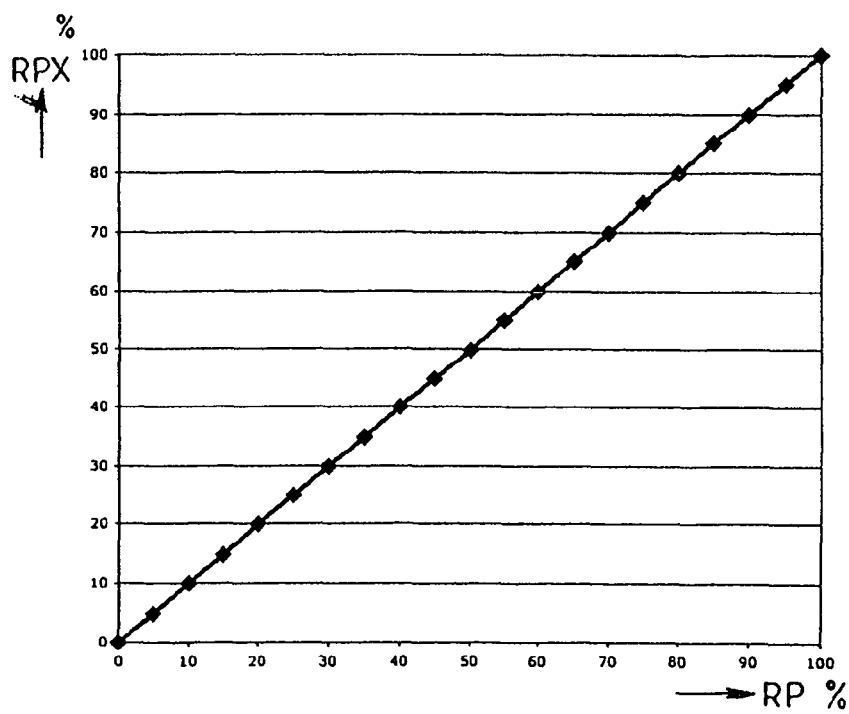

FIGS. 7 to 9 illustrate the principle of the digital manipulation of the screen points in which the applications which have just been given are inscribed by referring to FIGS. 2 to 6 as an example. These figures illustrate the correspondence between the screen points indicated on the abscissa in % of coverage by the point RP, of the cell containing the latter and the distribution of pixels RPX, appearing on the axis of ordinates, created on the plate for each pass. FIG. 7 shows that all the screen points of a dimension smaller than 50% theoretically are enlarged digitally at the first pass to 50%, which corresponds to the zone in light grey of FIG. 2 and the zone indicated in FIG. 4. In a similar way, FIG. 8 gives by the graph represented the manipulation carried out during the second pass. The horizontal part of the graph corresponds to the distribution of the pixels located in the circle in light grey of FIG. 3. FIG. 9 presents the correspondence between the screen points and the pixels for the following passes.

Figure 10:
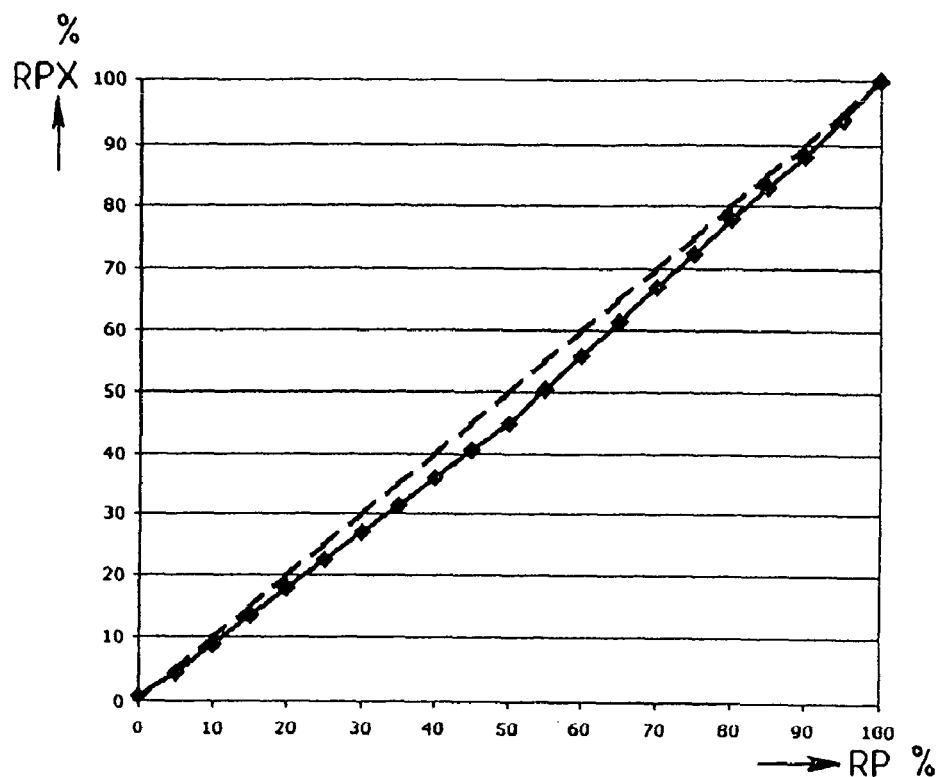
FIG. 10 is a schematic representation of the offset of the digital over inking of the point in the half-tones with respect to the theoretical line of reference during applications of the construction by multiple passages according to the invention.

It should be noted that one can superimpose an offset of the theoretical line of reference in order to modify the over inking of the screen points in the half-tones, in particular, as it is illustrated in FIG. 10, as an example.

Figure 11:
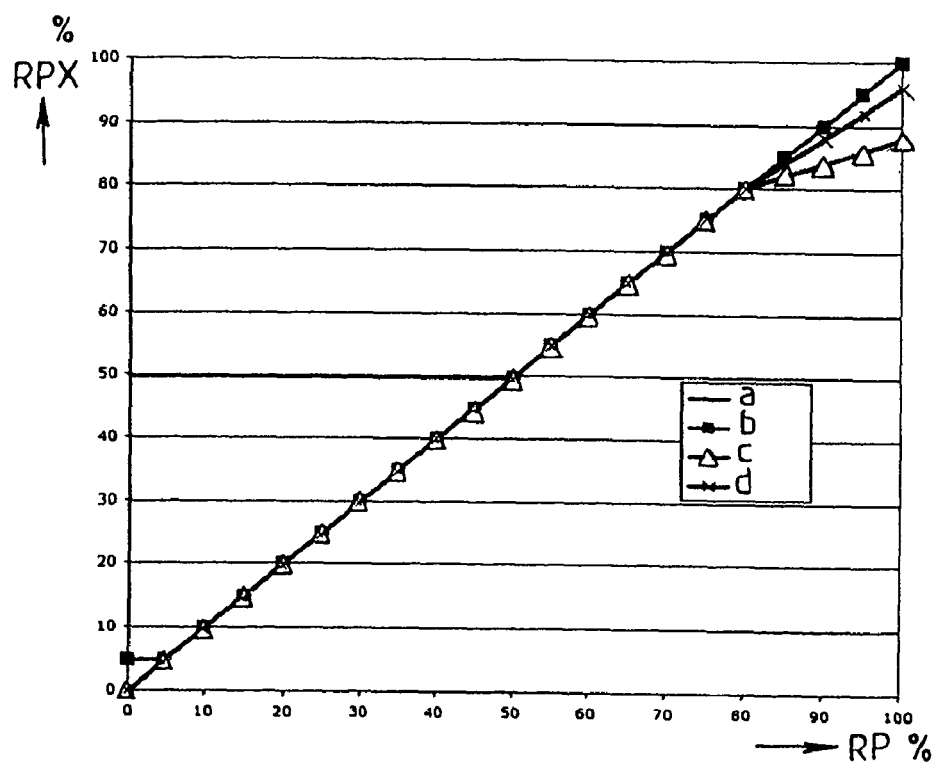
FIGS. 11 to 13 illustrate three variants of the construction by multiple passages, of a screen point according to the invention.
Figure 12:
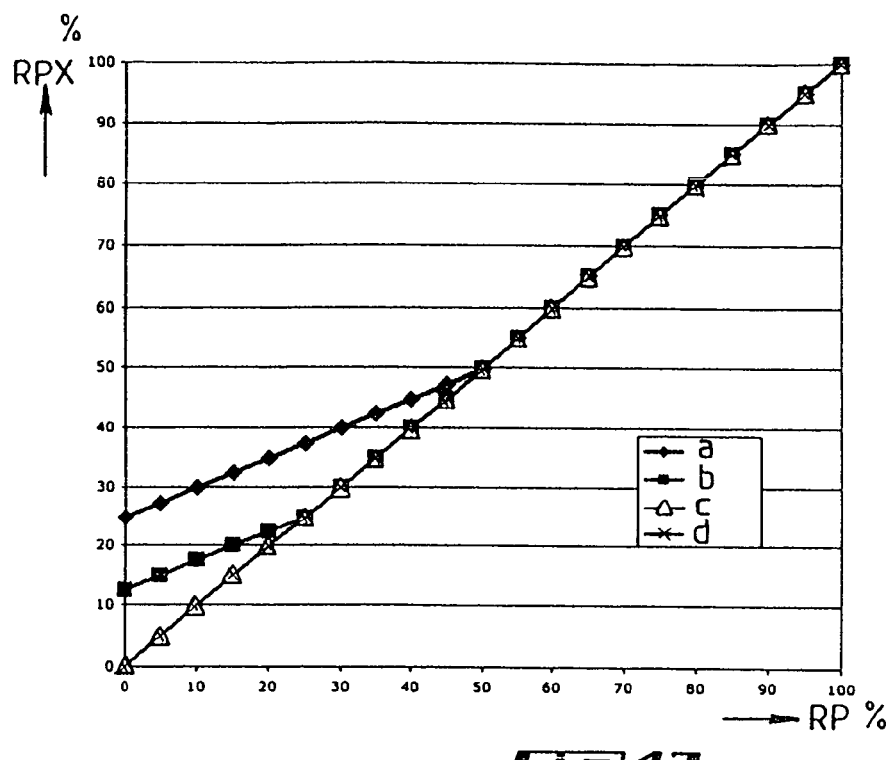
Figure 13:
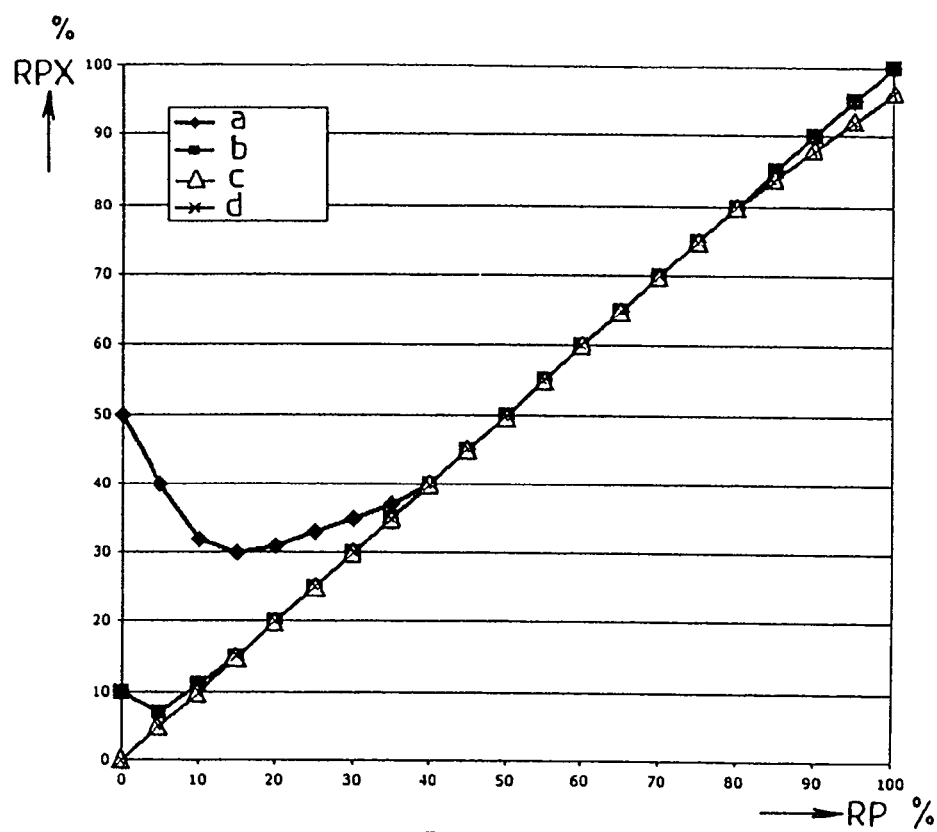
Figure 15:
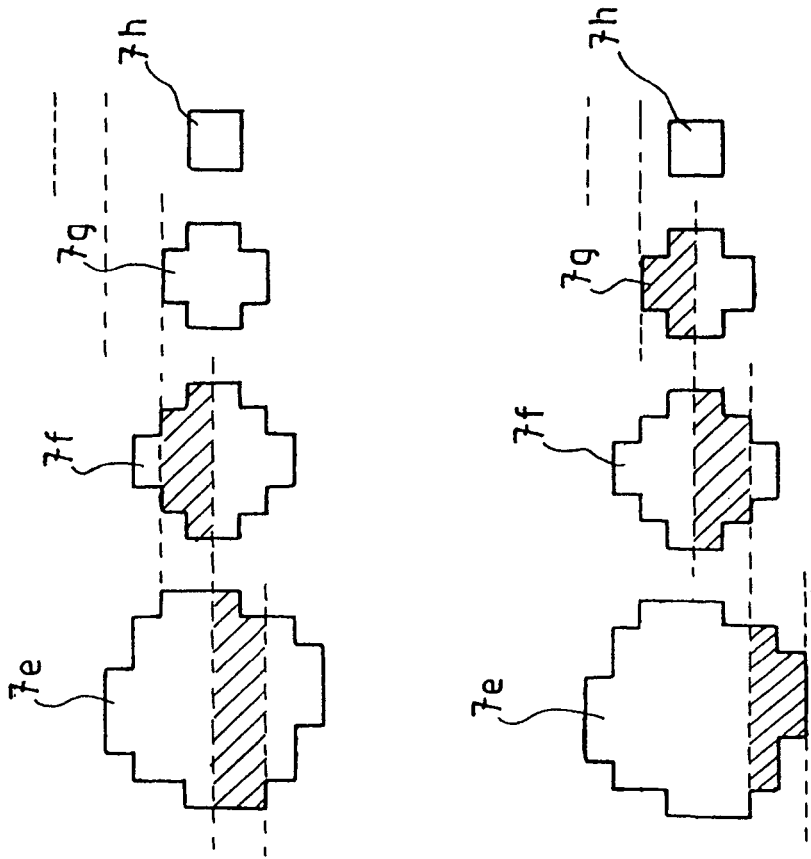
FIGS. 15A to 15F illustrate six scans and their result, of the procedure of construction of one screen point according to FIG. 14.
Figure 15:
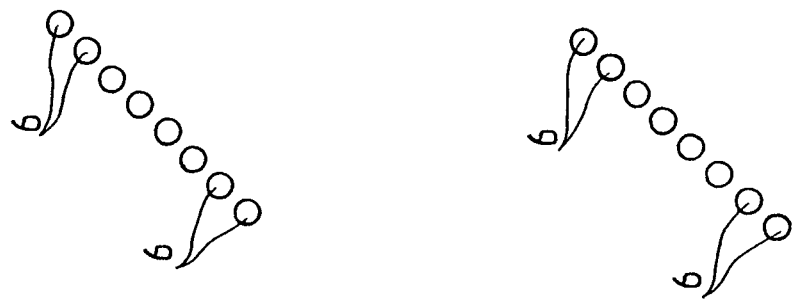

According to the invention, one can also combine the manipulation of the highlighted screen points with the corresponding manipulation of the points of shadow, as one sees in FIG. 11 and which shows the correspondence between the screen points and the distribution of pixels for four successive scans a, b, c, d. FIGS. 12 and 13 show two variations of the strategy of construction of the screen points, with four scans each time.

Up to now, the production of the screen points has been described by accomplishing several passes and thus successive scans on the surface, for example, by back and forth trips of a laser beam in its set. In accordance with the invention, the different scans can also be implemented by using several laser beams operating in parallel, which makes it possible to do just one pass by superimposing the effects of the different lasers in several simultaneous scans. Thus, 48 lasers could be separated into four sections of twelve lasers each, with the first section doing the work relative to the first pass, the second section performing the work relative to the second pass and so on. As a variation, one could use only 45 of the 48 lasers by letting three lasers idle and regrouping the lasers in five sections of nine each. This would make it possible to carry out a quintuple scan. According to another variation, one could distribute the lasers into eight sections of six lasers each and carry out eight scans at a speed eight times greater.

This second mode of implementing the invention will be described in more detail later by referring to FIG. 14. FIG. 14 illustrates schematically the pyramidal configuration of a screen point labeled 1 on a base layer 5. The figure shows, going from the base to the apex, four concentric zones, e to h (from the exterior to the interior) of decreasing width, which could be carried out by four successive exposures to the irradiation light. The figure also shows zone 7e to 7h, which is irradiated each time. At each exposure, the corresponding zone has been irradiated with a quarter of the energy. At the first exposure, the size of the irradiated zone of the point was 80 micrometers, on the second exposure, it was 60 micrometers, on the third and fourth exposures respectively, it was 40 and 20 micrometers. The thick diagonal lines represent the shoulders 3 of the point after its execution. The back 5 of the plate has been produced by exposure from below to harden the base of the plate material so as to ensure the support of the points. The different sizes of the points can be executed according to an appropriate image grid processing software known by the name of RIP (Raster Image Processor Software).

FIGS. 15A to 15F illustrate in a schematic way, as a simplified example, the execution of the screen point according to FIG. 14, involving the use of a mobile 8 head, holding eight laser beams noted as 6, the first laser beam being at the bottom, the eighth at the top of the inclined row of lasers. The direction of scan is indicated by arrow F1. The laser head advances after each pass by a step of 20 micrometers in the direction of arrow F2. FIGS. 15A to 15F illustrate the different positions of the head and, by the hatching, the exposure to the light carried out on each of the six scans. One thus confirms that lines L4 and L5 (seen in FIG. 14) have received four times the laser light in the zone labeled 7H in FIG. 14, line L3 has been exposed three times in the zone noted 7G in FIG. 14, line L2 twice in the zone 7f in FIG. 14, and line L1 once in the zone 7E. See also the hatched zones in FIG. 15. This is valid, in a symmetrical way, for lines L6 to L8.

The distribution of energy produced with these four scans and during a single pass makes it possible, after engraving, to generate a controlled shoulder of the screen point.

The description of the invention which has just been done was given only as an example and can be modified in multiple ways provided one respects the essential characteristics of the invention. This proposes in a general way the creation of printed forms in relief, for flexography, typography and any other similar application. The invention also covers applications of embossing in relief and applications of the rotogravure type. These reliefs can be produced on supports in the form of plate, sleeve and cylinders. The invention covers the use of photopolymers used in liquid, semi-liquid or solid phase. The plates can be with or without a base, compressible or not, on a polyester, or similar, support, on a steel or aluminum support. The lasers are preferably diodes in semi-conductor technology. The lasers are modulated between a minimal luminous emission power, zero as the case may be, and a nominal maximum power. The successive passes can be done at identical or different levels of power in order to optimize the results. The plates can have a thickness of between 0.4 mm and 6.35 mm or thereabouts. The hardness of the plates, sleeves or cylinders produced is typically comprised between about 25 ShA and 75 ShD. The plates can be single layer or multi-layered. The densities of energy necessary to crosslink the photosensitive materials are typically between 40 and 1,000 mJ/cm$^2$. It is preferably comprised between 50 and 1.50 mJ/cm$^2$. The lasers are preferably diodes operating at a wavelength of 405 nm or with wavelengths comprised between 390 and 410 nm. One can also apply this method to lasers operating in the UV range with wavelengths of 325 to 375 nm, or thereabouts. The useful power per laser can vary between 10 and 300 mW, preferably between 10 and 200 mW. The power applied to each laser module can be different with respect to the others. The size of the elementary pixels used to scan the surface of the relief-printed form is typically from 6 to 15 micrometers. The number of lasers used is any number and it can vary between 1 and 256 or even more, according to their power or the energy required to reticulate the material. The resolution of the image is comprised between about 1,000 dpi and 8,000 dpi. The screen rulings concerned by the applications go from about 50 lpi to 200 lpi. The number of scans or successive passes is typically comprised between 2 and 16, preferably 3 to 4, and the number of different RIP files used during these scans is typically from 2 to 5, preferably 3 or 4,

The invention claimed is:

1. A method for producing a relief image arrangement said relief image arrangement comprising a base layer and a layer of photosensitive material fixed on the base layer, wherein the layer of photosensitive material is selectively crosslinkable to create at least one screen point therein, the method comprising the steps of:

providing a plurality of zones of the at least one photosensitive material for creating the at least one screen point;

successively exposing the photosensitive material to modulated light energy to selectively crosslink the photosensitive material and form the at least one screen point therein, wherein the at least one screen point that is formed comprises a pyramidal shape having a smaller top surface and shoulders sloping away from the smaller top surface;

wherein the at least one screen point is formed by the successive exposure of the photosensitive material to the modulated light energy comprising at least one laser in the zones of the at least one screen point and wherein the plurality of zones of the at least one screen point are exposed to different levels of light energy;

wherein the at least one screen point is contacted with several back-and-forth passes of the laser; and wherein each successive exposure of the modulated light energy comprises a fraction of the energy necessary for the total crosslinking of the photosensitive material to modulate the total energy received at each point of the relief image arrangement.

2. The method according to claim 1, wherein the at least one screen point is thrilled by a multitude of pixels.

3. The method according to which claim 1, wherein the laser operates at a wavelength between 390 and 410 nm.

4. The method according to claim 1, wherein light energy is in the UV range at a wavelength from 325 to 375 inn.

5. The method according to claim 1, wherein the at least one screen point is produced by different scans implemented by using several lasers operating in parallel during a single pass.

6. The method according to claim 1, wherein the at least one screen point is produced by using a head supporting a row of a plurality of lasers offset in the direction perpendicular to the scan, which advances after each scan in the direction perpendicular to the scan of a step corresponding to the width of a zone of different exposure in the direction of advance.

7. The method according to claim 5, wherein the power per laser is between 10 and 300 mW.

8. The method according to claim 2, wherein the resolution of the relief image produced is between 1,000 dpi and 8,000 dpi.

9. The method according to claim 2, wherein the at least one screen point comprises screen rulings between 60 lpi and 200 lpi.

10. The method according to claim 1 wherein the relief image arrangement is produced on a support and wherein the support comprises a plate, a sleeve or a cylinder.

11. The method according to claim 5, wherein the lasers are modulated in power.

12. The method according to claim 1, wherein the image is produced by multiple scans during a single pass or during successive passes with driving the at least one lasers by digital files making it possible to modulate the total energy received at each point of the relief image arrangement.

* * * * *

UNITED STATES PATENT AND TRADEMARK OFFICE
CERTIFICATE OF CORRECTION

| | |
|---|---|
| PATENT NO. | : 8,399,178 B2 |
| APPLICATION NO. | : 12/733986 |
| DATED | : March 19, 2013 |
| INVENTOR(S) | : Dominique Bertrand et al. |

It is certified that error appears in the above-identified patent and that said Letters Patent is hereby corrected as shown below:

In the Claims

Column 10, Line 5

Delete "at least one lasers" and replace it with -- at least one laser --

Signed and Sealed this
Fourteenth Day of May, 2013

Teresa Stanek Rea
*Acting Director of the United States Patent and Trademark Office*